United States Patent [19]
Lou et al.

[11] Patent Number: 5,729,165
[45] Date of Patent: Mar. 17, 1998

[54] 1.5V FULL-SWING BOOTSTRAPPED CMOS LARGE CAPACITIVE-LOAD DRIVER CIRCUIT SUITABLE FOR LOW-VOLTAGE DEEP-SUBMICRON CMOS VLSI

[75] Inventors: Jea Hong Lou, Taipei; James B. Kuo, Yi-Lan, both of Taiwan

[73] Assignee: National Science Council, Taipei, Taiwan

[21] Appl. No.: 627,482

[22] Filed: Apr. 4, 1996

[51] Int. Cl.$^6$ ............................................. H03B 1/00
[52] U.S. Cl. .......................... 327/112; 327/391; 327/589; 326/88
[58] Field of Search .................. 326/88, 92; 327/108, 327/109, 110, 111, 112, 390, 391, 589

[56] References Cited

U.S. PATENT DOCUMENTS

| | | | |
|---|---|---|---|
| 5,268,600 | 12/1993 | Yeu | 326/88 |
| 5,369,320 | 11/1994 | Satani et al. | 327/108 |
| 5,489,859 | 2/1996 | Kawaguchi et al. | 326/88 |

OTHER PUBLICATIONS

IEEE Journal of Solid-State Circuits,vol.30,No. 2 Feb. 1995 "Design of Tapered Buffers with Local Interconnect Capacitance," Brian S. Checkauer et al.

IEE Journal of Solid-State Circuits,vol.29, No. 9, Sep. 1994 "Design of CMOS Tapered Buffer for Minimum Power-Delay Product" Joo-Sun Choi et al.

IEEE Journal of Solid-State Circuits,vol.29,No. 11, Nov. 1994 "High-Dpeed Low-Switching Noise CMOS Memory Data Output Buffer" E. Chioffi et al.

IEEE Journal of Solid-State Circuits,vol.30, No. 7,Jul. 1995 "A 3/5 Compatible I/O Buffer" Marcel J.M. Pelgrom et al.

IEEE Journal of Solid-State Circuits,vol.30, No. 6,Jun. 1995 "Low-Power CMOS/BICMOS Drivers and Receivers for On-Chip Interconnects"A.Bellaouar et al.

IEEE Journal of Solid-State Circuits, vol. 30, No.1, Jan. 1995 "A Bootstrapped Bipolar CMOS (B2CMOS) Gate for Low-Voltage".

IEEE Journal of Solid-State Circuits,vol.29,No. 6,Jun. 1994 "Full-Swing Schottky BICMOS/BINMOS and the Effects of Operating Frequency and Supply Voltage Scaling" A. Bellaouar et al.

IEE Journal of Solid-State Circuits,vol.30, No. 9, Sep. 1995 "Design of a 1.5 V Full-Swing Bootstrapped BICMOS Logic Circuit" Raymond Y.V. Chik et al.

Primary Examiner—Timothy P. Callahan
Assistant Examiner—Jeffrey Zweizig
Attorney, Agent, or Firm—Cushman Darby & Cushman IP Group of Pillsbury Madison & Sutro, LLP

[57] ABSTRACT

A 1.5V full-swing bootstrapped CMOS large capacitive-load driver circuit using two bootstrap capacitors to enhance the switching speed for low-voltage deep-submicron CMOS VLSI. For a supply voltage of 1.5V, the full-swing bootstrapped CMOS driver circuit shows a 2.2 times improvement in switching speed in driving a capacitive load of 10 pF as compared to the conventional CMOS driver circuit. Even for a supply voltage of 1V, this full-swing bootstrapped CMOS large capacitive-load driver circuit is still advantageous.

3 Claims, 10 Drawing Sheets

1.5V FULL-SWING BOOTSTRAPPED CMOS LARGE CAPACITIVE-LOAD DRIVER CIRCUIT SUITABLE FOR LOW-VOLTAGE DEEP-SUBMICRON CMOS VLSI

BACKGROUND OF THE INVENTION

The present invention relates to a bootstrapped CMOS large capacitive-load driver circuit suitable for low-voltage deep-submicron CMOS VLSI. The circuit adapts capacitive-load features by using two bootstrap capacitors to enhance the Switching speed for low-voltage deep-submicron CMOS VLSI.

For a CMOS VLSI circuit with a large fan-out or driving a long interconnect metal lines or for a CMOS output pad driver, the capacitive load is large. For driving a large capacitive load, the design of the driver circuit is critical for determining the switching speed. In the past, CMOS tapered buffers for driving large output loads have been reported, as B. S. Cherkauer and E. G. Friedman, "Design of Tapered Buffer with Local Interconnect Capacitance", IEEE J. Solid-State Circuits, Vol. 30, No. 2, PP. 151–155, February 1995 and J. S. Choi, and K. Lee, "Design of CMOS Tapered Buffer for Minimum Power-Delay Product", IEEE J. Solid-State Circuits, Vol. 29, No. 9, PP. 1141–1145, September 1994. Other CMOS output buffers have also reported, for example, E. Chioffi, F. Maloberti, G. Marchesi, and G. Torelli, "High-Speed, Low-Switching Noise CMOS Memory Data Output Buffer", IEEE J. Solid-State Circuits, Vol. 29, No. 11, PP. 1359–1365, November 1994 and M. J. M. Pelgrom and E. C. Dijkmans, "A 3/5 Compatible I/O Buffer," IEEE J. Solid-State Circuits, Vol. 30, No. 7, pp. 823–825, July 1995. For next-generation CMOS VLSI circuits, low supply voltage is the trend. Although a small supply voltage driver is reported in A. Bellaouar, I. S. Abu-Khater, and M. I. Elmasry, "Low-Power CMOS/BiCMOS Drivers and Receivers for On-Chip Interconnects". IEEE J. Solid-State Circuits, Vol. 30, No. 6, pp. 696–700, June 1995, its output voltage is not in full-swing. Taking advantage of the good driving capability of bipolar devices, BiCMOS static logic circuits using a small supply voltage have been reported in S. H. K. Embabi, A. Bellaouar, and K. Islam, "A Bootstrapped Bipolar CMOS gate for Low-Voltage Applications." IEEE J. Solid-State Circuits, Vol. 30, No. 1, pp. 47–53, January 1995, A. Bellaouar, I. S. Abu-Khater, M. I. Elmasry, A. chikima, "Fully-Swing Schottky BiCMOS/BiNMOS and the Effects of Operating Frequency and Supply Voltage Scaling," IEEE J. Solid-State Circuits, Vol. 29, No. 6, pp. 693–699, June 1994 and R. Y. V. Chik and C. A. T. Salama, "Design of a 1.5 V Full-Swing Bootstrapped BiCMOS Logic circuit," IEEE J. Solid-State Circuits, Vol. 30, No. 9, September 199A5. At present, the bipolar device has been applicable in low-voltage BiCMOS static logical circuit due to its good driving features. For the next generation of CMOS VLSI, however, such bipolar devices are unsuitable for deep-submicron CMOS VLSI since the latter requires low-voltage source. Since the threshold voltages of the deep-submicron CMOS devices cannot be scaled down accordingly with the supply voltage, how to design a CMOS driver using a low supply voltage for the next-generation CMOS VLSI using deep-submicron CMOS devices is a challenge.

SUMMARY OF THE PRESENT INVENTION

The object of the present invention is to provide a 1.5V full-swing bootstrapped BiCMOS logic circuit which utilizes a capacitive-load feature to generate a 1.5 V full-swing output so as to drive a deep submicron CMOS device by such a low voltage.

According to the present invention, the bootstrapped portion of the logic circuit is divided into two parts. During a cycle period, one part of the bootstrapped portion operates as an upward transition and the other part operates as a downward transition and vice versa during the next cycle period so that the switching speed is enhanced. It will be shown that for a supply voltage of 1.5V, the full-swing bootstrapped CMOS driver circuit of the present invention shows a 2.2 times improvement in switching speed in driving a capacitive load of 10 pF as compared to the conventional CMOS driver circuit. Even for a supply voltage of 1V, this full-swing bootstrapped CMOS large capacitive-load driver circuit is still advantageous.

DETAILED DESCRIPTION OF THE PRESENT INVENTION

Figure 1:
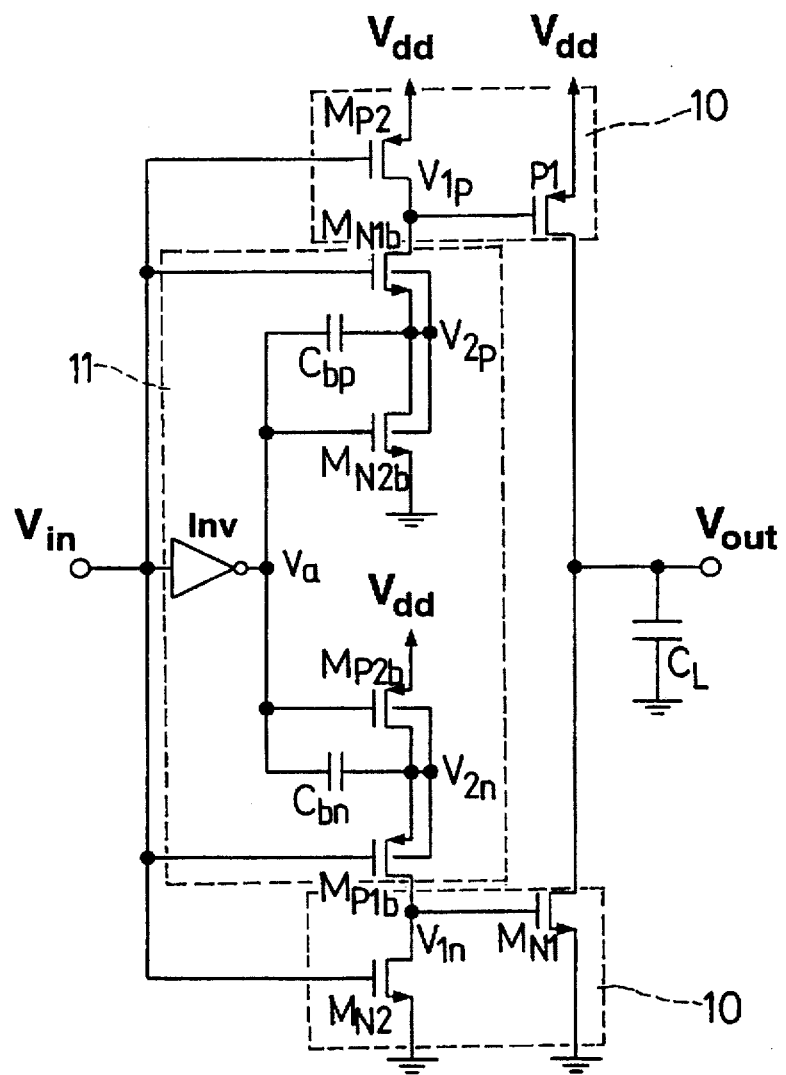
FIG. 1 shows a schematic diagram of a 1.5 V full-swing bootstrapped CMOS Driving circuit in accordance with the present invention.

FIG. 1 shows a 1.5V full-swing bootstrapped CMOS driver circuit in accordance with the present invention which is composed of the fundamental segment 10 and the bootstrap segment 11. In the fundamental segment 10, there are two PMOS devices—$M_{P1}$ and $M_{P2}$ and two NMOS devices—$M_{N1}$ and $M_{N2}$. In the bootstrap segment 11, there are two NMOS devices—$M_{N1b}$ and $M_{N2b}$, and two PMOS devices—$M_{P1b}$ and $M_{P2b}$. In addition, a CMOS inverter (INV) and two bootstrap capacitances $C_{bp}$ and $C_{bn}$ are also included in the bootstrap segment 11, where the NMOS $M_{N1b}$, $M_{N2b}$ and the capacitor $C_{bp}$ are used for the pull-up transient;, and the PMOS $M_{P1b}$, $M_{P2b}$ and the capacitor $C_{bn}$ are used for the pull-down transient.

Figure 2A:
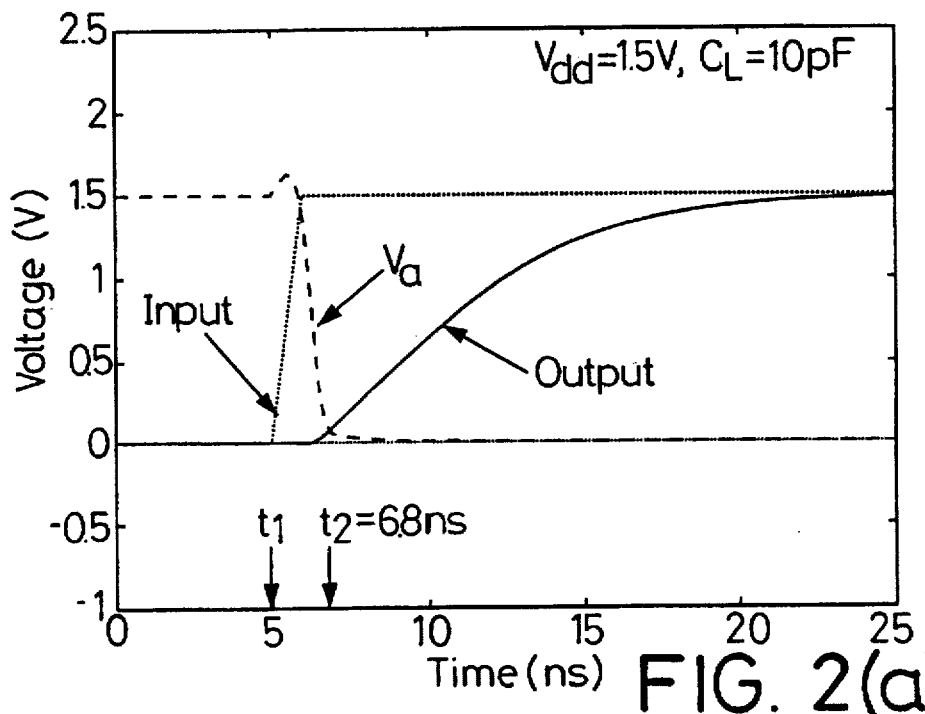
FIGS. 2(a) and 2(b) represent the transient waveforms of the circuit of FIG. 1 driving an output load of 10 pF during the pull-up transient.
Figure 2B:
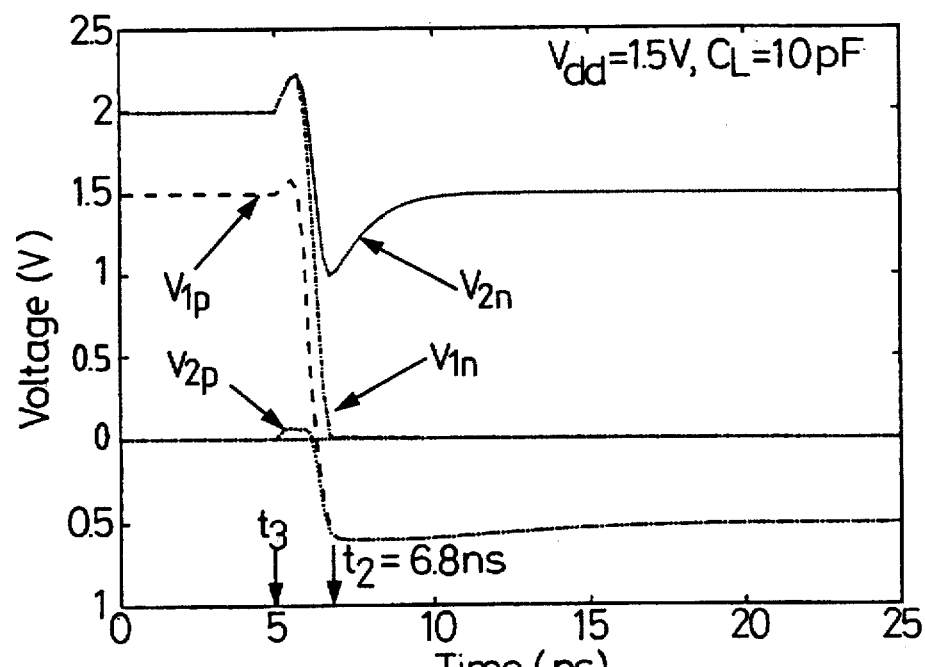
Figure 3A:
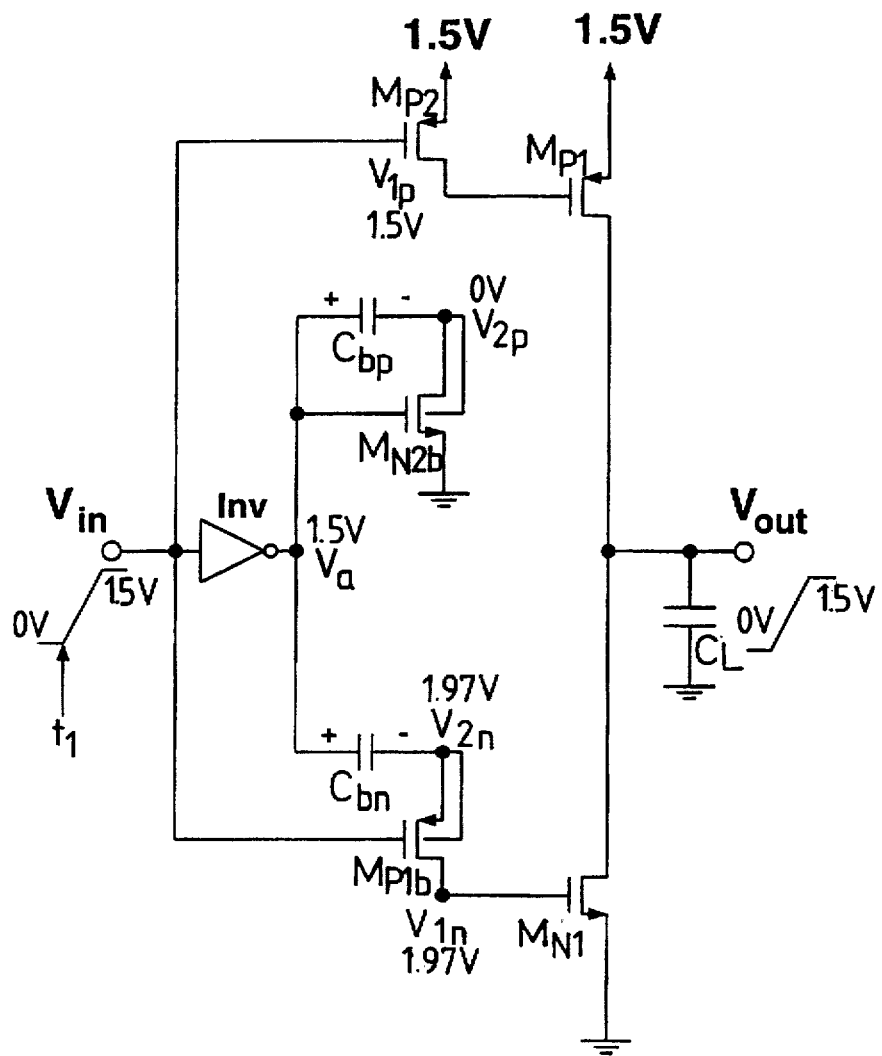
FIGS. 3(a) and 3(b) represent equivalent circuits of the 1.5 V full-swing bootstrapped CMOS driver circuit of FIG. 1 at the time prior to the pull-up transient and after the input ramp-up period, respectively.
Figure 3B:
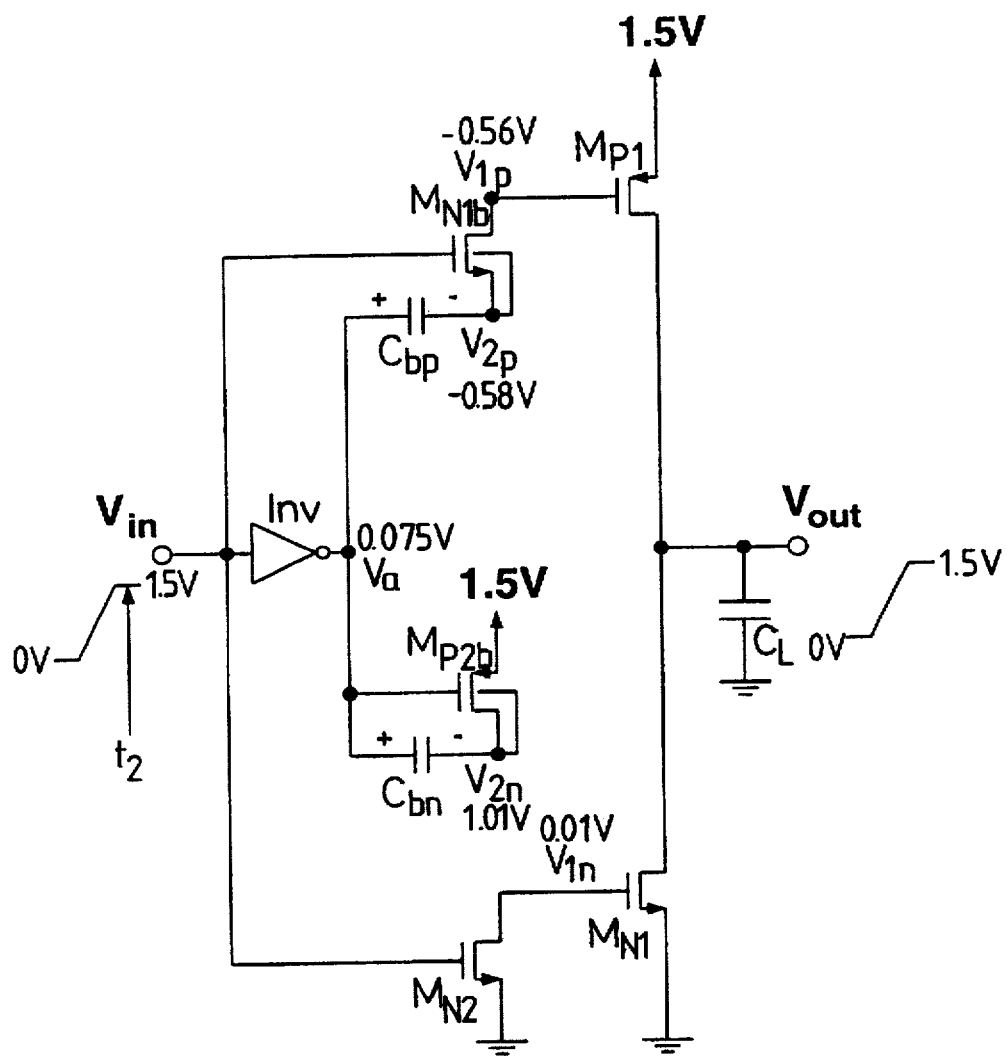

FIGS. 2(a) and 2(b) show the transient waveforms of the 1.5V full-swing bootstrapped CMOS driver circuit of the present invention in driving an output load of 10 pF during the pull-up transient. As shown in the figures, the voltage at the right side of the bootstrap capacitor $C_{bp}$ can go below 0V during the transient. During the pull-up transient, the operation of the full-swing bootstrapped CMOS driver circuit is divided into two periods in consideration with the bootstrap capacitor $C_{bp}$: (1) the charge build-up period and (2) the bootstrap period. As shown in FIG. 3(a), prior to the pull-up transient at the time t1, the input is at 0V and the output Va of the inverter is 1.5V. Therefore, the NMOS $M_{N1b}$ and $M_{N2}$ are off; the NMOS $M_{N2b}$ is on. Consequently, at the output of the driver, $V_{out}$, which is indirectly driven by the PMOS $M_{P1b}$ in the bootstrap segment, is at 0V. On the other hand, NMOS $M_{N2b}$ and the capacitor $C_{bp}$ of the bootstrap segment 11 are separated from the PMOS $M_{P2}$ and $M_{P1}$ of the fundamental segment 11. As a result, the bootstrap capacitor $C_{bp}$ has charge of 1.5 $C_{bp}$ Coulomb since the left side of the bootstrap capacitor is pulled to 1.5V and the right side thereof $V_{2p}$ to 0V ($M_{N2b}$ is on). FIG. 3(b) shows an equivalent circuit of the 1.5V full-swing bootstrapped CMOS driver circuit of the present invention at the time after the input ramp-up period at t2. After the input ramp-up period, the output of the inverter changes to 0.075V. Therefore, the right side of the bootstrap capacitor $C_{bp}$ is disconnected from ground since $M_{N2b}$ is off. Instead, the bootstrapped capacitor $C_{bp}$ is connected to the gate of the PMOS $M_{P1}$ since the NMOS $M_{N1b}$ is on. Due to the voltage change at the left side of the bootstrap capacitor $C_{bp}$ from 1.5V to 0.075V (Va=1.5 V to 0.075 V) from the t1 to t2, the right side of the bootstrap capacitor $C_{bp}$ changes from 0V to $-0.58V$ ($V_{2p}$=0 V to $-0.58$ V). As a result, the output voltage can switch at a faster pace since the gate of the NMOS $M_{P1}$ is driven at $-0.56V$. As shown in FIG. 2, the output voltage can go up to the full-swing value—1.5V.

Figure 4A:
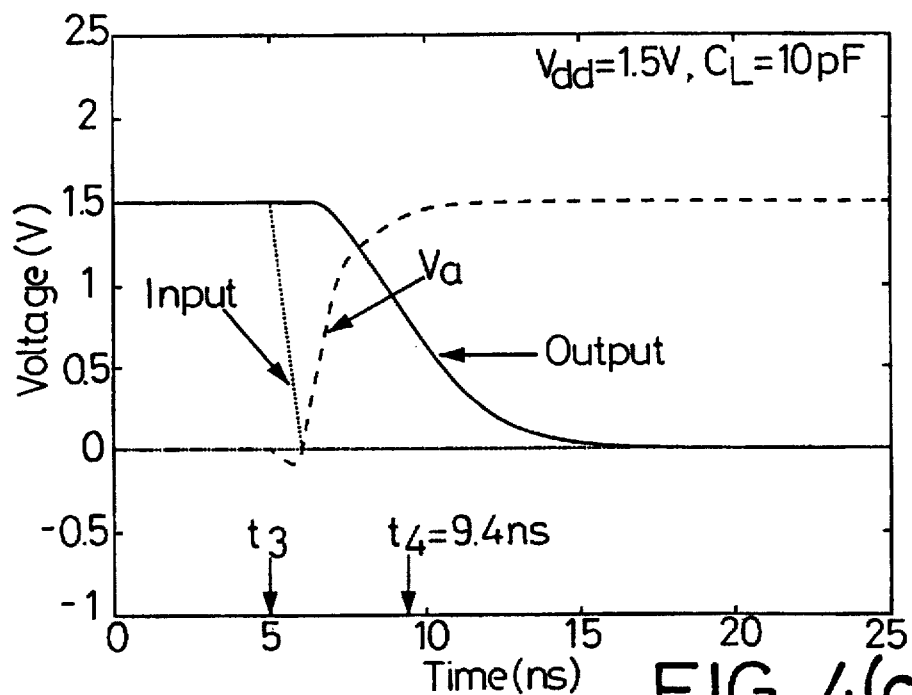
FIGS. 4(a) and 4(b) show the transient waveforms of the 1.5 V full-swing bootstrapped CMOS driver circuit of FIG. 1 driving an output load of 10 pF during the pull-down transient.
Figure 4B:
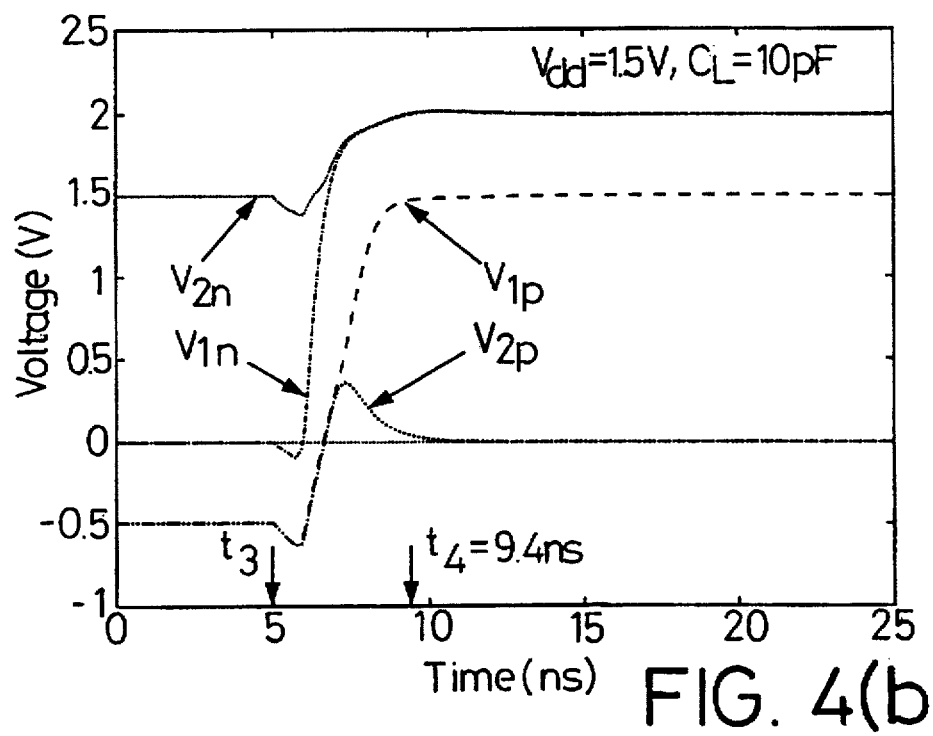
Figure 5A:
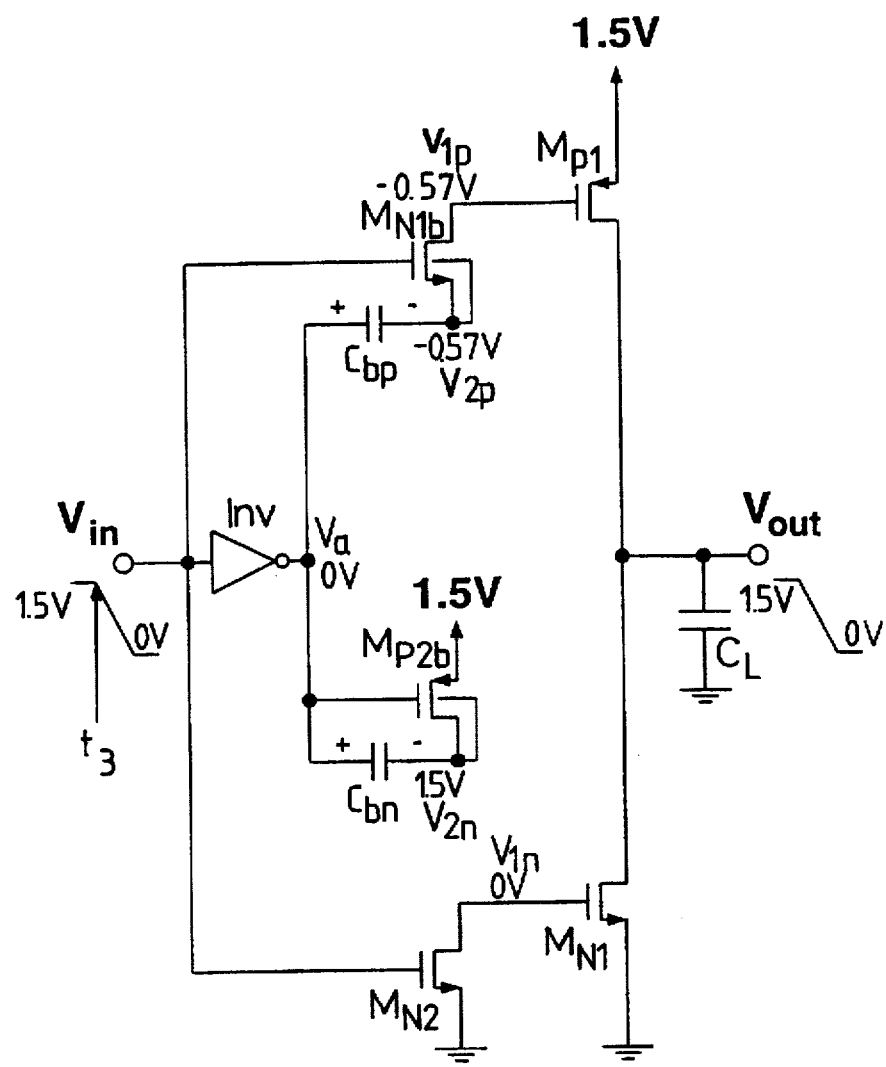
FIGS. 5(a) and 5(b) represent the equivalent circuits of the 1.5 full-swing bootstrapped CMOS driver circuit of FIG. 1 at the time prior to the pull-down transient and after the input ramp-down period, respectively.
Figure 5B:
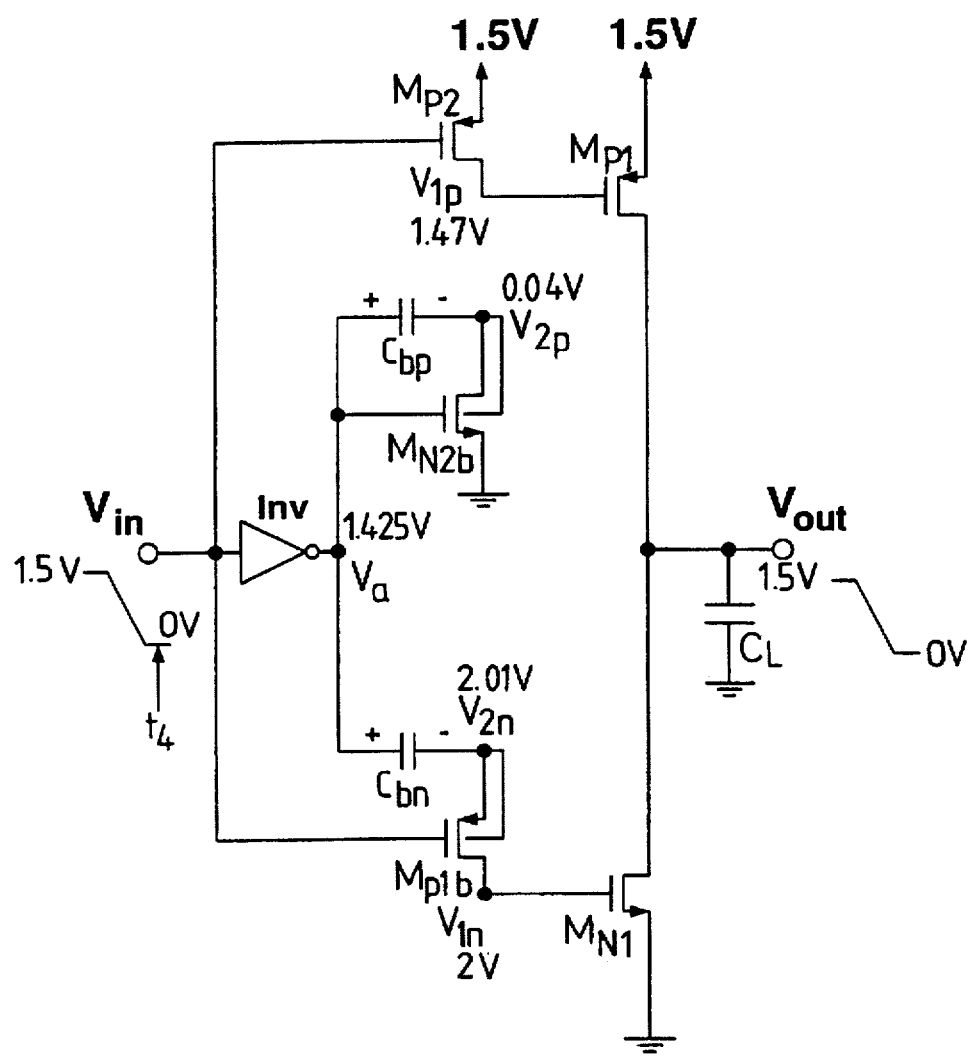

Pull-down transient has a complementary configuration. FIG. 4 shows the transient waveforms of the 1.5V full-swing bootstrapped CMOS driver circuit of the present invention in driving an output load of 10 pF during the pull-down transient. As shown in the figure, the right side of the bootstrap capacitor $C_{bn}$ ($V_{2n}$) can go above 1.5V during the pull-down transient. During the pull-down transient, the operation of the full-swing bootstrapped CMOS driver circuit of the present invention is also divided into two periods in consideration with the bootstrap capacitor $C_{bn}$. As shown in FIG. 5(a), prior to the pull-down transient at t3, the input is at 1.5V and the output Va of the inverter is at 0V. Therefore, the PMOSs $M_{P1b}$ and $M_{P2}$ are off; the PMOS $M_{P2b}$ is on. Consequently, at the output of the driver, Vout, which is indirectly driven by the NMOS $M_{N1b}$ in the bootstrap segment 11, is at 1.5V. On the other hand, the PMOS $M_{P2b}$ and capacitor $C_{bn}$ of the bootstrap segment 11 are separated from the NMOSs $M_{N1}$ and $M_{N1}$ of the fundamental segment 10. As a result, the capacitor $C_{bn}$ has charge of 1.5 $C_{bn}$ Coulomb since the left side of the capacitor $C_{bn}$ is pulled to 0V and the right side $V_{2n}$ thereof is to 1.5V (the PMOS $M_{P2b}$ is on). FIG. 5(b) shows an equivalent circuit of the 1.5V full-swing bootstrapped CMOS driver circuit of the present invention at the time after the input ramp-down period at t4. After the input ramp-down period, the output Va of the inverter changes to 1.425V. Therefore, the right side of the bootstrap capacitor $C_{bn}$ is disconnected from $V_{dd}$ since the PMOS $M_{P2b}$ is off. Instead, the bootstrapped capacitor $C_{bn}$ is connected to the gate of the NMOS $M_{N1}$ since the PMOS $M_{P1b}$ is on. Due to the voltage change at the left side of the bootstrap capacitor $C_{bn}$ from 0V to 1.425V (Va=0 V to 1.425 V) from t3 to t4, the right side of the bootstrap capacitor $C_{bn}$ changes from 1.5V to 2.01V (V2n=1.5 V to 2.01 V). As a result, the output voltage can switch at a faster pace since the gate of the NMOS $M_{N1}$ is driven at 2V. As shown in FIG. 4, the output voltage can go down to the full-swing value—0V.

In order to evaluate the performance of the bootstrapped CMOS driver circuit of the present invention, a 1.5V full-swing bootstrapped CMOS driver circuit as shown in FIG. 1 based on a 0.8 µm CMOS technology has been designed. All MOS transistors in FIG. 1 have a channel length of 0.8 µm. The channel widths of the PMOS $M_{P1}$ and NMOS $M_{N1}$ are 80 µm and 40 µm, respectively. The channel widths of the NMOS $M_{N1b}$ and PMOSs $M_{P2}$ and $M_{P2b}$ are all 20 µm. The channel width of the PMOS $M_{P1b}$ is 40 µm. The channel width of the NMOS $M_{N2b}$ and $M_{N2}$ is 10 µm. The capacitances of the two bootstrap capacitances $C_{bp}$ and $C_{bn}$ are 0.35 pF and 0.25 pF, respectively. The threshold voltage of the CMOS devices is about ±0.8 V.

Figure 6:
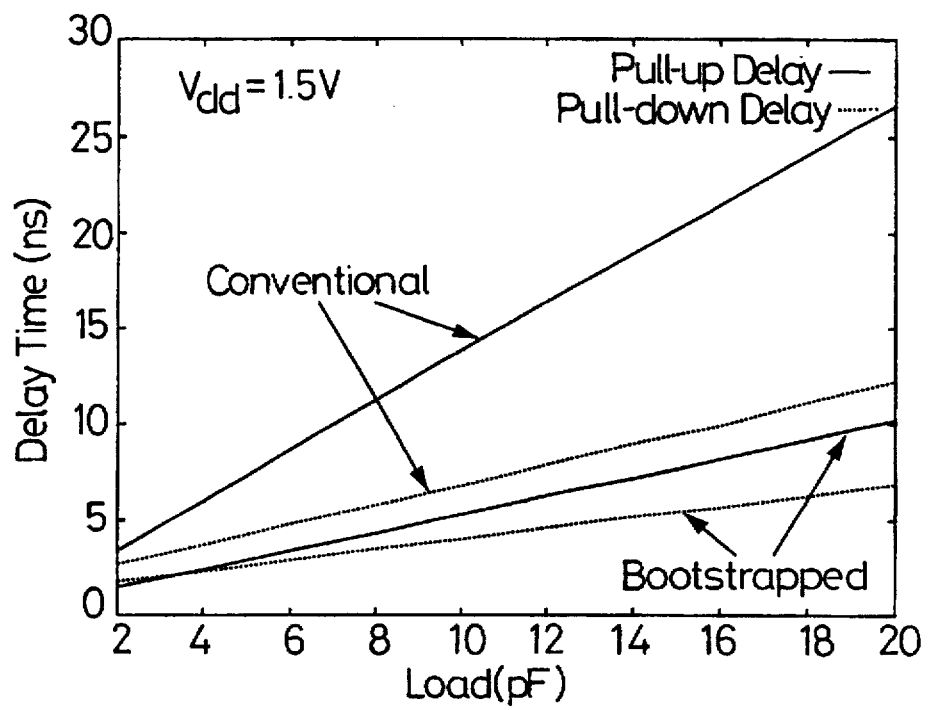
FIG. 6 shows the pull-up delay and the pull-down delay time vs. load capacitance of the 1.5 V full-swing bootstrapped CMOS driver circuit of FIG. 1 during the pull-up and the pull-down transients.

FIG. 6. is a curve diagram showing the pull-up delay and the pull-down delay times vs. load capacitance of the 1.5V full-swing bootstrapped CMOS driver circuit of the present invention during the pull-up and the pull-down transients. Also shown in the figure are the delay times for the conventional CMOS driver circuit using a PMOS device of 80 µm/0.8 µm and an NMOS device of 40 µm/0.8 µm. As shown in the figure, the full-swing bootstrapped CMOS driver provides a switching speed improvement of 2.6x and 1.7x for the pull-up and pull-down transients, respectively.

Figure 7:
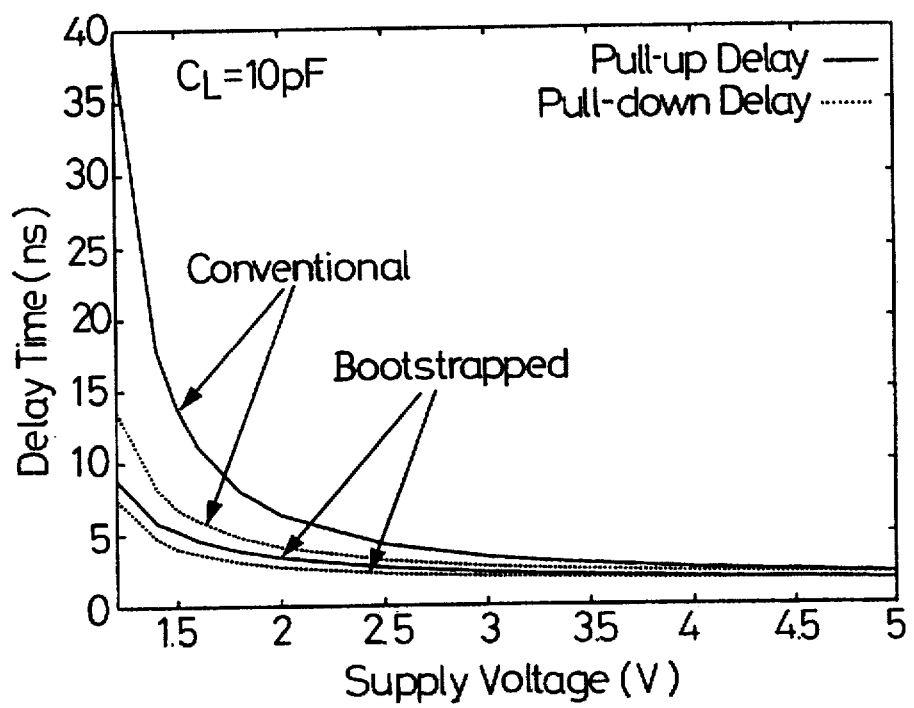
FIG. 7 shows the pull-up and the pull-down delay times vs. supply voltage of the 1.5 V full-swing bootstrapped CMOS driver circuit of FIG. 1 driving an output load of 10 pF.

FIG. 7 is a curve diagram showing the pull-up and the pull-down delay times vs. supply voltage of the 1.5 V full-swing bootstrapped CMOS driver circuit of the present invention in driving an output load of 10 pF. As shown in the figure, for a large supply voltage, the difference in the delay time of the CMOS driver circuit using the full-swing bootstrapped one and the conventional one is not much. As the supply voltage voltage is scaled down, the advantages of the bootstrapped one increases substantially. At a supply voltage of 1.2V, the bootstrapped one provides an improvement of 4.4x and 1.8x for the pull-up transient and the pull-down transient, respectively.

Figure 8:
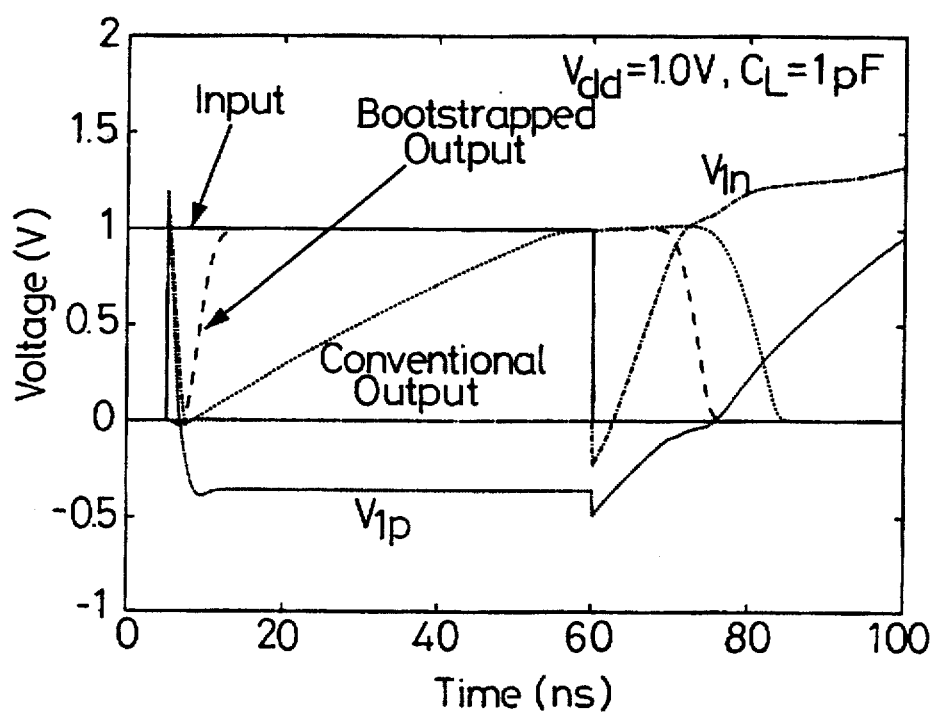
FIG. 8 shows the transient waveforms of the full-swing bootstrapped CMOS driver circuit of FIG. 1 driving an output load of 1 pF and using a supply voltage of 1V.

Low supply voltage is becoming a trend for deep-submicron CMOS VLSI, where the conventional CMOS driver circuit may be too slow in driving a large capacitive load due to the relatively large value in the threshold voltage of the CMOS devices. The full-swing bootstrapped CMOS driver circuit presented in the present invention can still work for a supply voltage of 1V. At such a low supply voltage, bootstrapped scheme is very important. FIG. 8 shows the transient waveforms of the full-swing bootstrapped CMOS driver circuit of the present invention in driving an output load of 1 pF and using a supply voltage of 1V. Also shown in the figure are the transient waveforms for the conventional CMOS driver circuit. With the bootstrapped one, the delay time improves 5.6x and 1.6x, respectively.

The present invention provides a full-swing bootstrapped 1.5V CMOS driver circuit having two bootstrap capacitors to enhance the transient process for low-voltage CMOS VLSI. For a supply voltage of 1.5V, the full-swing bootstrapped CMOS driver circuit shows a 2.2 times improvement in switching speed as compared to the conventional CMOS driver circuit. Even for a supply voltage of 1V, the full-swing bootstrapped CMOS driver circuit of the present invention is still advantageous.

It is apparent that although the invention has been described in connection with preferred embodiments, those skilled in the art may make changes to certain features of the preferred embodiments without departing from the spirit and scope of the invention as defined in the appended claims.

We claim:

1. A full-swing bootstrapped CMOS large capacitive-load circuit, comprising a fundamental segment and a bootstrapped segment in which the fundamental segment comprises two first P-type metal oxide semiconductor (PMOSs) devices and two first N-type metal oxide semiconductor (NMOSs) devices, and the bootstrapped segment comprises two second PMOSs, two second NMOSs and a first and a second bootstrap capacitors, said two first PMOS of the fundamental segment are driven by said second N-type metal oxide semiconductors (NMOSs) and said first bootstrap capacitor of the bootstrapped segment and said first NMOS of the fundamental segment are driven by the second PMOSs and the second bootstrap capacitor of the bootstrapped segment; the bootstrapped further comprises an inverter of which the output is used to control either one of said second NMOS or one of said second PMOS of the bootstrapped segment to be conducted.

2. The circuit as claimed in claim 1, wherein the NMOSs and the first bootstrap capacitor of the bootstrapped segment are operated for enhancing the switching speed of pull-up transient.

3. The circuit as claimed in claim 1, wherein the PMOSs and the second bootstrap capacitors of the bootstrapped segment are operated for enhancing the switching speed of pull-down transient.

* * * * *